United States Patent

Ka

[11] Patent Number: 6,094,384
[45] Date of Patent: Jul. 25, 2000

[54] COLUMN REDUNDANCY CIRCUIT

[75] Inventor: Soon Taeg Ka, Ichon, Rep. of Korea

[73] Assignee: Hyundai Electronics Industries Co., Ltd., Ichon, Rep. of Korea

[21] Appl. No.: 09/342,522

[22] Filed: Jun. 29, 1999

[30] Foreign Application Priority Data

Jun. 29, 1998 [KR] Rep. of Korea ............. 98-24817

[51] Int. Cl.[7] .................................................. G11C 7/00
[52] U.S. Cl. .................. 365/200; 365/225.7; 371/10.3
[58] Field of Search .................. 365/200, 225.7, 365/185.09, 96; 371/10.2, 10.3

[56] References Cited

U.S. PATENT DOCUMENTS

| | | | |
|---|---|---|---|
| 4,601,019 | 7/1986 | Shah et al. | 365/200 |
| 5,293,348 | 3/1994 | Abe | 365/230.03 |
| 5,299,161 | 3/1994 | Choi et al. | 365/201 |
| 5,319,589 | 6/1994 | Yamagata et al. | 365/119 |
| 5,430,679 | 7/1995 | Hiltebeitel et al. | 365/200 |
| 5,446,692 | 8/1995 | Haraguchi et al. | 365/200 |
| 5,469,388 | 11/1995 | Park | 365/200 |
| 5,491,664 | 2/1996 | Phelan | 365/200 |
| 5,495,445 | 2/1996 | Proebsting | 365/200 |
| 5,544,113 | 8/1996 | Kirihata et al. | 365/200 |
| 5,555,212 | 9/1996 | Toshiaki et al. | 365/200 |
| 5,574,688 | 11/1996 | McClure et al. | 365/200 |
| 5,870,341 | 2/1999 | Lin et al. | 365/200 |
| 5,953,269 | 9/1999 | Manning | 365/200 |
| 5,978,290 | 11/1999 | Fujita | 365/200 |

*Primary Examiner*—Tan T. Nguyen
*Attorney, Agent, or Firm*—Jacobson, Price, Holman & Stern, PLLC

[57] ABSTRACT

A column redundancy circuit prevents a time delay in the normal and repair operations without using an additional input/output line and input/output sense-amp. In the column redundancy circuit, since a normal Y-decoder does not receive an output signal of a fuse box when a column line is enabled, a column enable operation speed increases, and a complete repair operation having no error is achieved without using an additional circuit in a repair operation.

2 Claims, 6 Drawing Sheets

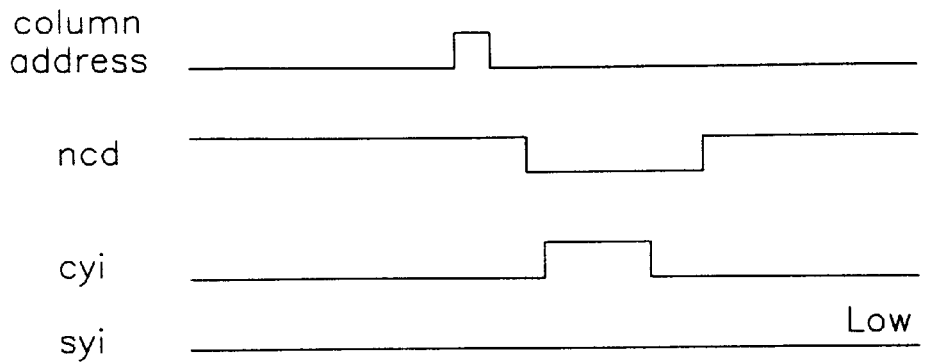
Fig.2A
(PriorArt)
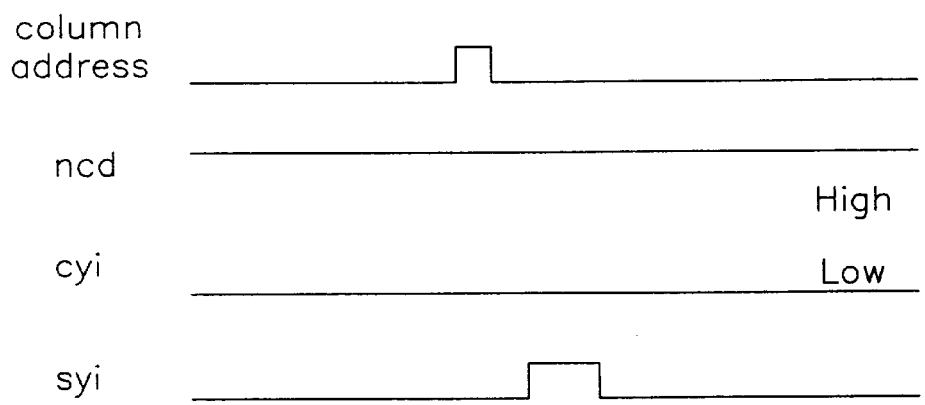
Fig.2B
(PriorArt)

COLUMN REDUNDANCY CIRCUIT

BACKGROUND OF THE INVENTION

1. Field of the Invention

The present invention relates to a column redundancy circuit. More particularly, it relates to a column redundancy circuit which performs a column repair operation of a semiconductor memory element at a high-speed.

2. Description of the Prior Art

Generally, under the condition that even one cell among a plurality of fine cells constituting a dynamic random access memory (DRAM) is defective, the DRAM cannot perform a normal function. Therefore, in this case, a redundancy method that the defective cell is replaced with a spare memory cell previously mounted into the DRAM in order to increase a production yield has been widely employed.

FIG. 1 depicts a block diagram of a conventional column redundancy circuit. As shown in FIG. 1, a normal Y-decoder 12 and a fuse box 14 are mounted to a column segment 10, and a normal Y-decoder 22 and a fuse box 24 are mounted to a column segment 20.

The fuse boxes 14 and 24 receive a column address as an input, generate a normal column disable (NCD) signal for controlling corresponding normal Y-decoders 12 and 22 according to a defectiveness of a corresponding column address, and controls spare column lines sy<0> and sy<1>, respectively.

The normal Y-decoders 12 and 22 receive a column address as well as the normal column disable (NCD) signal generated from corresponding fuse boxes 14 and 24, decode the column address and the normal column disable (NCD) signal, and then control corresponding column lines cy<0:(m-1)> and cy<m:(2m-1), respectively.

According to the aforementioned column redundancy circuit, a normal column line cyi is enabled in a normal state, and a spare column line syi is enabled in a repair state. This is determined according to whether a fuse inside of fuse boxes 14 and 24 is blown or not.

For example, as shown in FIG. 2A which shows signal waveforms employed to a column enable operation when a normal state is determined in FIG. 1, if a column address being input to the fuse boxes 14 and 24 and to the normal Y-decoders 12 and 22 is enabled, a normal column disable (NCD) signal generated from the fuse boxes 14 and 24 drops from a high pre-charge state to a low pre-charge state. The normal Y-decoders 12 and 22 receive a normal column disable (NCD) signal of the low precharge state as an input, and enable a normal column line cyi corresponding to the input column address. At this time, a spare column line syi maintains a low state.

As shown in FIG. 2B which shows signal waveforms employed in a column enable operation when a repair state is determined in FIG. 1, if a column address being input to the fuse boxes 14 and 24 and to the normal Y-decoders 12 and 22 is enabled and is in a repair state, the normal column disable (NCD) signal generated from the fuse boxes 14 and 24 continuously maintains a high precharge state, thus the column line cyi is not enabled while the spare column line syi is enabled.

According to the conventional column redundancy circuit, if the normal column (Y) line is enabled, the normal Y-decoder receives an output signal of the fuse box as an input, and enables a corresponding column line. In addition, in a redundancy state, the normal Y-decoder enables a repair column line on the basis of the output signal of the fuse box, thereby causing a problem in lowering an operation speed of a column line.

In order to obviate such problem, U.S. Pat. No. 5,495,445, entitled "REDUNDANCY SCHEME FOR MEMORY CIRCUITS", is provided in which content of a selected equivalent redundant element is prior to a content of a defective element.

In other words, the U.S. Pat. No. 5,495,445 senses the location of a defective element and programs a circuit to allow a corresponding redundant element to be selected when the defective element is addressed. If the defective element is addressed, defective information is provided on a data line, and accurate information provided on the data line by a redundant element corresponding to the defective element appears prior to the defective information. As a result, normal and redundancy columns are simultaneously enabled, wherein the redundancy column overwrites the normal column.

As to the operations of the U.S. Pat. No. 5,495,445, a normal column and a redundancy column are simultaneously enabled when a redundancy column address is input. In this case, a bit line sense-amp of the normal column and a bit line sense-amp of the redundancy column are simultaneously operated, and the data generated from the two bit line sense-amps is outputted to the outside via one data line commonly connected to the two bit line sense-amps. In this case, a driving ability of a signal generated from the redundancy column is increased, so that an input/output sense-amp generates a signal of the redundancy column.

However, since the data line is not divided in the U.S. Pat. No. 5,495,445, the U.S. Pat. No. 5,495,445 employs a fighting structure wherein a collision between the data of the normal column and the data of the redundancy column occurs in case that the data of the normal column and the data of the redundancy column are simultaneously generated. Since an electric potential of the data line is determined by a fighting operation, a complete repair operation is not achieved in case of an error such as a connection between the data line and a power line.

SUMMARY OF THE INVENTION

Accordingly, the present invention is directed to a column redundancy circuit that substantially obviates one or more of the problems due to limitations and disadvantages of the related art.

It is an objective of the present invention to provide a column redundancy circuit which prevents a time delay in the normal and repair operations without using an additional input/output line and an input/output sense-amp.

It is another objective of the present invention to provide a column redundancy circuit which performs a complete repair operation without an error in a repair operation.

To achieve the above objectives in a semiconductor memory device including a plurality of column segments and a normal column decoder which is mounted at every column segment and designates a normal column line of a corresponding column segment, a column redundancy circuit includes:

- a local data bus line which is divided at every column segment; and
- a fuse box which is mounted at every column segment receives a column address and a contrary column address selection address, and drives a spare column line mounted at every column segment, wherein when a selected column segment among the plurality of column segments is defective, a normal column line of the selected column segment and a spare column line of another column segment mounted to correspond to the selected column segment are simultaneously enabled, and the spare column line is driven by a repair signal of a fuse box of another column segment.

According to another aspect of the present invention, in a semiconductor memory device including a plurality of column segments, a normal column decoder which is mounted to correspond to each of the column segments and designates a normal column line of a corresponding column segment, and an input/output sense-amp driver mounted to correspond to each of the column segments, a column redundancy circuit includes:

a local data bus line which is connected to each input/output sense-amp driver, and is divided at every column segment; and a fuse box which is mounted at every column segment, receives a column address and a contrary column segment selection address from the outside, enables an input/output sense-amp driver of a defective segment when a selected column segment is defective, and disables an input/output sense-amp of a contrary column segment when a selected column segment is defective.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objectives and advantages of the present invention will become apparent from the following description in conjunction with the attached drawings in which:

FIG. 2A illustrates signal waveforms employed in a column enable operation when a normal state is determined in FIG. 1;

FIG. 2B illustrates signal waveforms employed in a column enable operation when a repair state is determined in FIG. 1;

DETAILED DESCRIPTION OF THE PREFERRED EMBODIMENT

A preferred embodiment of the present invention will now be described in detail with reference to the accompanying drawings.

Figure 1:
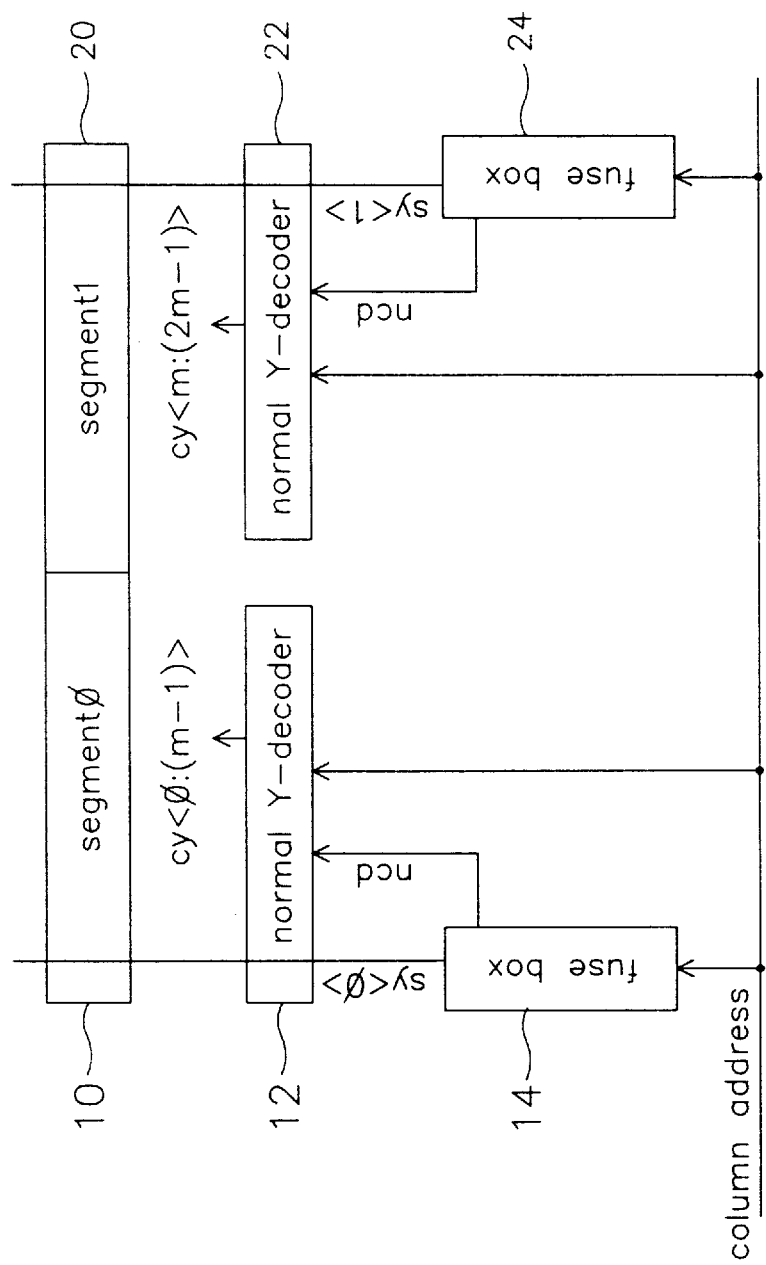
FIG. 1 illustrates a block diagram for explaining a column enable operation of a conventional semiconductor element.
Figure 3:
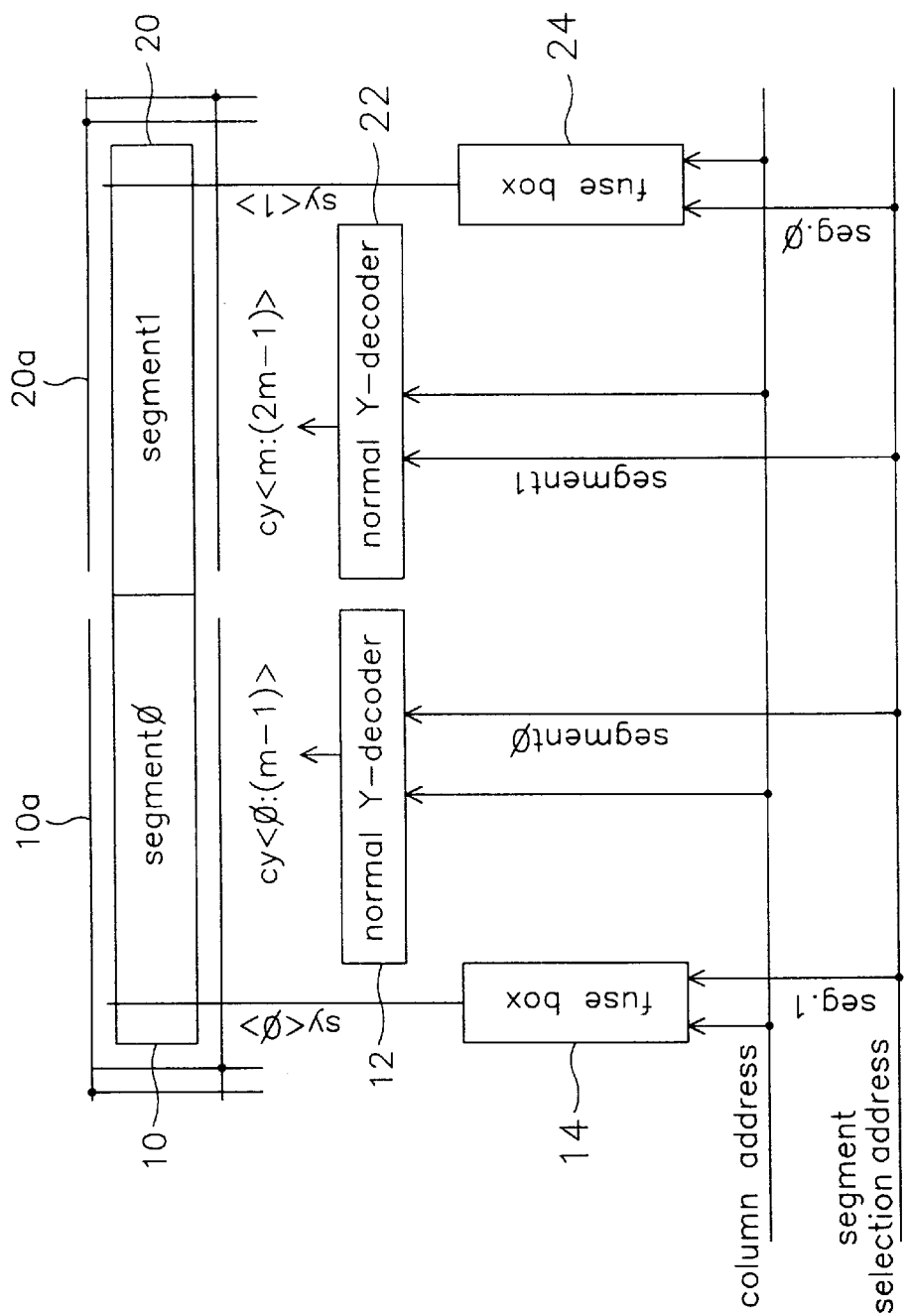
FIG. 3 illustrates a column redundancy circuit according to a preferred embodiment of the present invention.

FIG. 3 illustrates a column redundancy circuit according to a preferred embodiment of the present invention. As shown in FIG. 3, a normal Y-decoder 12 and a fuse box 14 are mounted to a column segment 10 having a plurality of column lines, and a normal Y-decoder 22 and a fuse box 24 are mounted to a column segment 20 having a plurality of column lines. A local data bus line 10a is mounted to the column segment 10, and a local data bus line 20a is mounted to the column segment 20. The local data bus lines 10a and 20a are separated from each other.

The fuse box 14 and the normal Y-decoder 12 of the column segment 10 and the fuse box 24 and the normal Y-decoder 22 of the column segment 20 receive a column address and a segment selection address as an input. The column addresses being input to the fuse boxes 14 and 24 and the normal Y-decoders 12 and 22 are the same. The segment selection address being input to the normal Y-decoder 12 is an address SEGMENT0 for selecting the column segment 10. The segment selection address being input to the normal Y-decoder 22 is an address SEGMENT1 for selecting the column segment 20.

The segment selection address being input to the fuse box 14 is an address SEG.1 for selecting a contrary column segment 20. The segment selection address being input to the fuse box 24 is an address SEG.0 for selecting a contrary column segment 10.

Operations of the column redundancy circuit shown in FIG. 3 will be described below with reference to FIGS. 4A–4B.

Figure 4A:
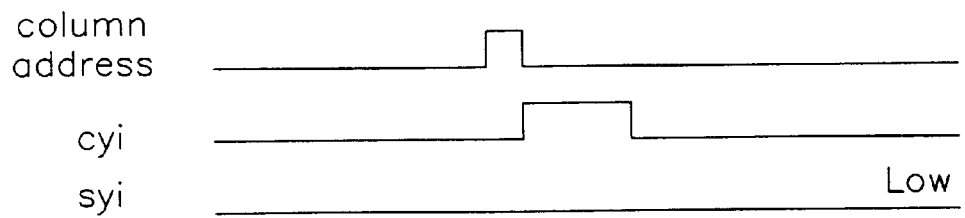
FIG. 4A illustrates signal waveforms employed in a column enable operation when a normal state is determined in FIG. 3.
Figure 4B:
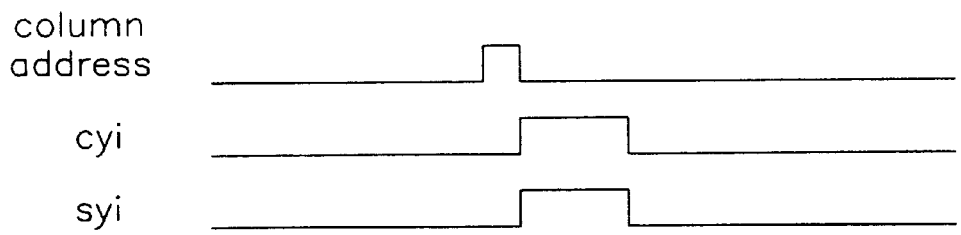
FIG. 4B illustrates signal waveforms employed in a column enable operation when a repair state is determined in FIG. 3.

FIG. 4A illustrates signal waveforms employed to a column enable operation when a normal state is determined in FIG. 3; and FIG. 4B illustrates signal waveforms employed to a column enable operation when a repair state is determined in FIG. 3.

As shown in FIG. 4A, in a normal column enable state, a column address and a segment selection address are input to the normal Y-decoders 12 and 22. The column address selects one normal column line cyi in each of column segments 10 and 20. The segment selection address selects one column segment between the column segments 10 and 20, and is determined as the column segment 10 in the embodiment of the present invention. Here, in an address input structure, the segment selection address being input to the normal Y-decoders 12 and 22 receives an address of a corresponding column segment as it is, the fuse box 14 of the column segment 10 receives an address of the column segment 20 as an input, and the fuse box 24 of the column segment 20 receives an address of the column segment 10 as an input.

Under this condition, if a normal column is defective, for example, if the column segment 10 of a normal state is defective, a fuse of the fuse box 24 of the other column segment 20 is blown according to a defective address code, and a spare column line syi of the column segment 20 is enabled as shown in FIG. 4B. At this time, a normal column line cyi is also enabled. That is, if the column segment 10 is defective, the normal column line cyi of the column segment 10 and the spare column line syi of the column segment 20 are simultaneously enabled.

In other words, assuming that a column line of the column segment 10 is defective, a fuse of the fuse box 24 of the column segment 20 is blown so that a redundancy operation on a defective address is performed.

Accordingly, since the normal Y-decoder does not receive repair information of the fuse box, a column enable operation speed is fast, and a complete repair operation is achieved without using an additional circuit.

Figure 5:
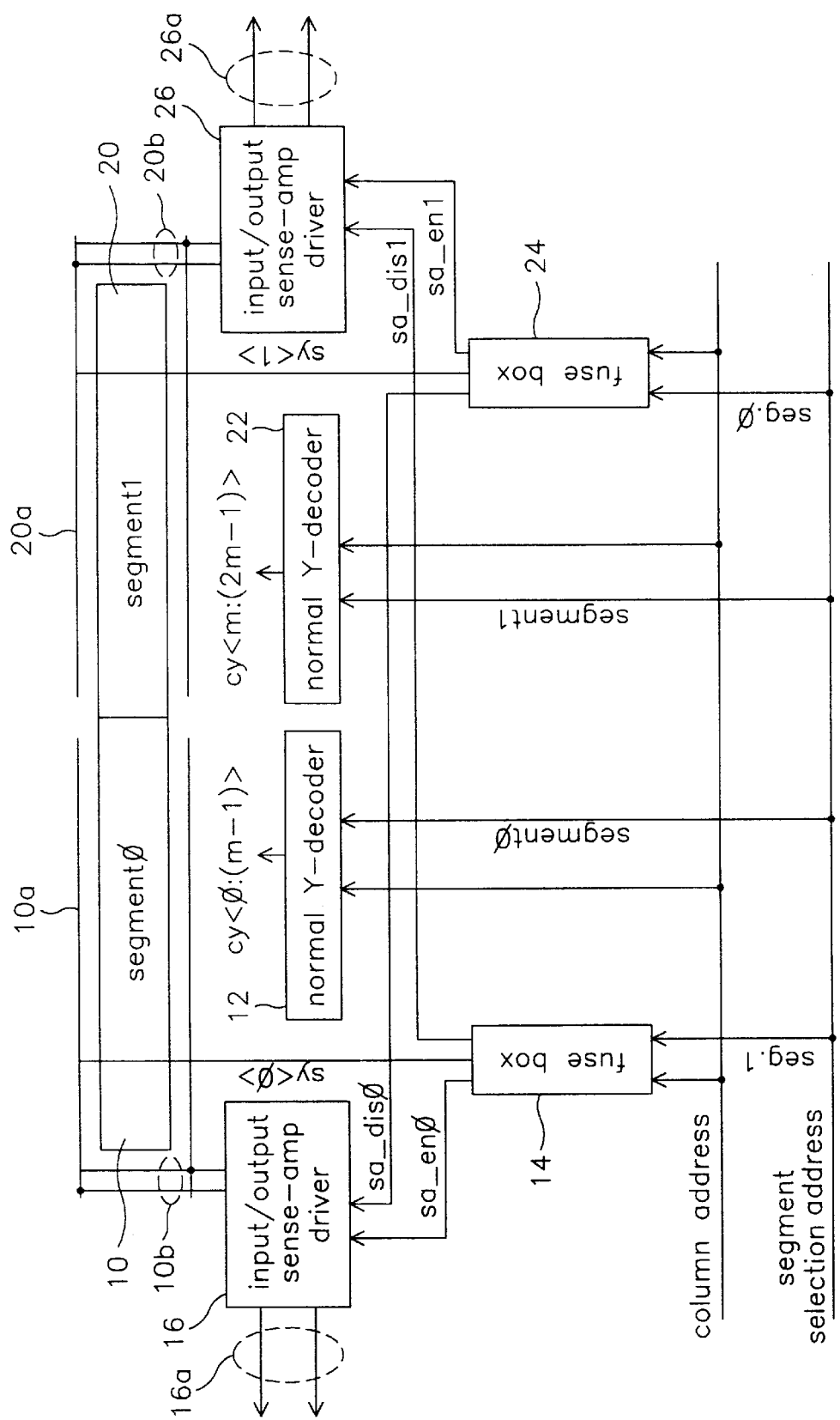
FIG. 5 illustrates a detailed block diagram of a column redundancy circuit according to a preferred embodiment of the present invention.

FIG. 5 illustrates a detailed block diagram of a column redundancy circuit according to the present invention. As shown in FIG. 5, the normal Y-decoder 12 and the fuse box 14 are mounted to the column segment 10, and the normal Y-decoder 22 and the fuse box 24 are mounted to the column segment 20. A local data bus line 10a is mounted to the column segment 10, and a local data bus line 20a is mounted to the column segment 20. The local data bus line 10a and the local data bus line 20a are separated from each other. The local data bus line 10a is connected to a corresponding input/output sense-amp driver 16 through the medium of the global data bus line 10b. The local data bus line 20a is connected to a corresponding input/output sense-amp driver 26 through the medium of the global data bus line 20b.

A column address and a segment selection address are input to the fuse box 14 and the normal Y-decoder 12 of the column segment 10 and the fuse box 24 and the normal Y-decoder 22 of the column segment 20. The column addresses being input to the fuse boxes 14 and 24 and the normal Y-decoders 12 and 22 are the same, a segment selection address being input to the normal Y-decoder 12 is an address for selecting the column segment 10, and a segment selection address being input to the normal Y-decoder 22 is an address for selecting the column segment 20.

A segment selection address being input to the fuse box 14 is an address SEG.1 for selecting a contrary column segment 20. A segment selection address being input to the fuse box 24 is an address SEG.0 for selecting a contrary column segment 10.

As a result, the fuse box 14 generates a sense-amp enable signal sa_en0 for controlling an input/output sense-amp driver 16 of the column segment 10, and generates a sense-amp disable signal sa_dis1 for controlling an input/output sense-amp driver 26 of the column segment 20. The fuse box 24 generates a sense-amp enable signal sa_en1 for controlling the input/output sense-amp driver 26 of the column segment 20, and generates a sense-amp disable signal sa_dis0 for controlling the input/output sense-amp driver 16 of the column segment 10.

Accordingly, for example, assuming that the column segment 10 is selected and a redundancy state is determined, a normal column line cyi of the normal Y-decoder 12 of the column segment 10 is enabled. At this time, the fuse box 24 of the other column segment 20 transmits a sense-amp enable signal sa_en1 to an input/output sense-amp driver 26 of the column segment 20.

Operations of the column redundancy circuit shown in FIG. 5 will be described with reference to FIG. 6.

Figure 6:
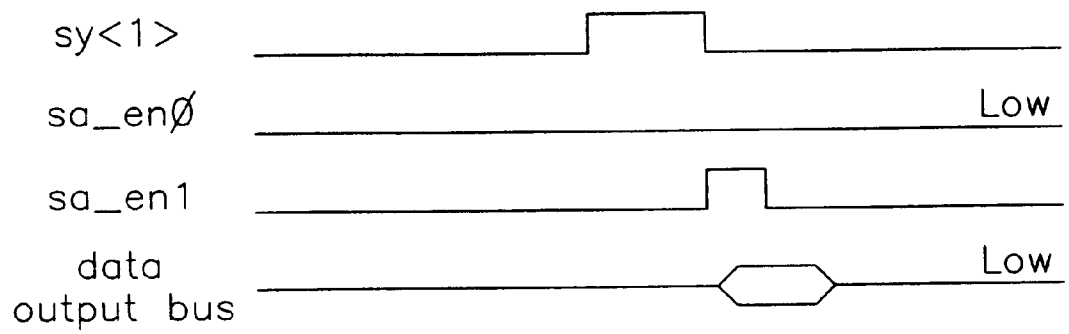
FIG. 6 illustrates a timing diagram of each part of the column redundancy circuit shown in FIG. 5.

FIG. 6 illustrates a timing diagram of each part of the column redundancy circuit shown in FIG. 5.

Referring to FIG. 6, if the column segment 10 is selected in a redundancy state, the data generated from a normal column line cyi of the normal Y-decoder 12 of the column segment 10 is loaded on a local data bus line 10a of a corresponding column segment 10 and is transmitted to an input/output sense-amp driver 16 through a global data bus line 10b. The data generated from a spare column line sy<1> of the fuse box 24 of the other column segment 20 is loaded on a local data bus line 20a of a corresponding column segment 20, and is transmitted to an input/output sense-amp driver 26 through a global data bus line 20b.

At this time, there is no operation in the fuse box 14. The fuse box 24 transmits a sense-amp disable signal sa_dis0 to the input/output sense-amp driver 16 and transmits a sense-amp enable signal sa_en1 to the input/output sense-amp driver 26, so that the input/output sense-amp driver 16 is disabled while the input/output sense-amp driver 26 is enabled. As a result, a data of a repaired spare column line sy<1> is loaded on a data output bus line 26a.

That is, the input/output sense-amp driver 16 is disabled by the output signal sa_dis0 (i.e., IOSA disable 0) of the fuse box 24, so that there is no data output in the input/output sense-amp driver 16. As a result, since only the input/output sense-amp drover 26 of the repaired column segment 20 outputs data, a column enable speed becomes faster.

As described above, in the column redundancy circuit according to the present invention, since a normal Y-decoder does not receive an output signal of a fuse box when a column line is enabled, a column enable operation speed becomes faster, and a complete repair operation having no error is achieved without using an additional circuit in a repair operation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor memory device including a plurality of column segments and a normal column decoder which is mounted at every column segment and designates a normal column line of a corresponding column segment, a column redundancy circuit comprising:

a local data bus line which is divided at every column segment; and a fuse box which is mounted at every column segment, receives a column address and a contrary column segment selection address, and drives a spare column line mounted at every column segment, wherein when a selected column segment among the plurality of column segments is defective, a normal column line of the selected column segment and a spare column line of another column segment mounted to correspond to the selected column segment are simultaneously enabled, and the spare column line is driven by a repair signal of a fuse box of the another column segment.

2. In a semiconductor memory device including a plurality of column segments, a normal column decoder which is mounted to correspond to each of the column segments and designates a normal column line of a corresponding column segment, and an input/output sense-amp driver mounted to correspond to each of the column segments, a column redundancy circuit comprising:

a local data bus line which is connected to each input/output sense-amp driver and is divided at every column segment; and a fuse box which is mounted at every column segment, receives a column address and a contrary column segment selection address from the outside, enables an input/output sense-amp driver of a defective segment when a selected column segment is defective, and disables an input/output sense-amp of a contrary column segment when a selected column segment is defective.

* * * * *